United States Patent [19]

Preisler et al.

[11] Patent Number: 5,250,507
[45] Date of Patent: Oct. 5, 1993

[54] PROCESS FOR PRODUCING MOLDED BODIES FROM PRECURSORS OF OXIDIC HIGH-TEMPERATURE SUPERCONDUCTORS

[75] Inventors: Eberhard Preisler; Joachim Bock, both of Erftstadt, Fed. Rep. of Germany

[73] Assignee: Hoechst Aktiengesellschaft, Frankfurt am Main, Fed. Rep. of Germany

[21] Appl. No.: 739,871

[22] Filed: Aug. 2, 1991

[30] Foreign Application Priority Data

Aug. 17, 1990 [DE] Fed. Rep. of Germany ....... 4026014

[51] Int. Cl.$^5$ .............. C25F 3/02; C25F 5/00; H01B 12/02
[52] U.S. Cl. ................... 505/1; 204/129.75; 204/130; 204/146; 505/728; 505/739
[58] Field of Search ............. 505/725, 728, 739, 1; 204/146, 130, 129.75

[56] References Cited

U.S. PATENT DOCUMENTS

| | | | |
|---|---|---|---|
| 3,334,029 | 8/1967 | Delafosse et al. | 204/32 |
| 5,047,391 | 9/1991 | Bock et al. | 505/1 |
| 5,059,581 | 10/1991 | Vasquez | 505/1 |
| 5,151,407 | 9/1992 | Provenzaho et al. | 505/1 |

FOREIGN PATENT DOCUMENTS 3830092  3/1990  Fed. Rep. of Germany .
59149 12/1967  German Democratic Rep. .
1-157010  6/1989  Japan .

*Primary Examiner*—John Niebling
*Assistant Examiner*—William T. Leader
*Attorney, Agent, or Firm*—Connolly & Hutz

[57] ABSTRACT

In the process for producing molded bodies from precursors of oxidic high-temperature superconductors of the BSCCO type, a copper mold of the desired shape which encloses a solidified bismuth strontium calcium cuprate melt is wired as anode in a direct current circuit composed of anode, cathode and an electrolyte, a dilute sulfuric acid is used as electrolyte and the electrolyte is subjected to a direct current of 1 to 50 mA.cm$^{-2}$ until the copper mold wired as anode is dissolved and the BSCCO molded body is laid bare.

4 Claims, 1 Drawing Sheet

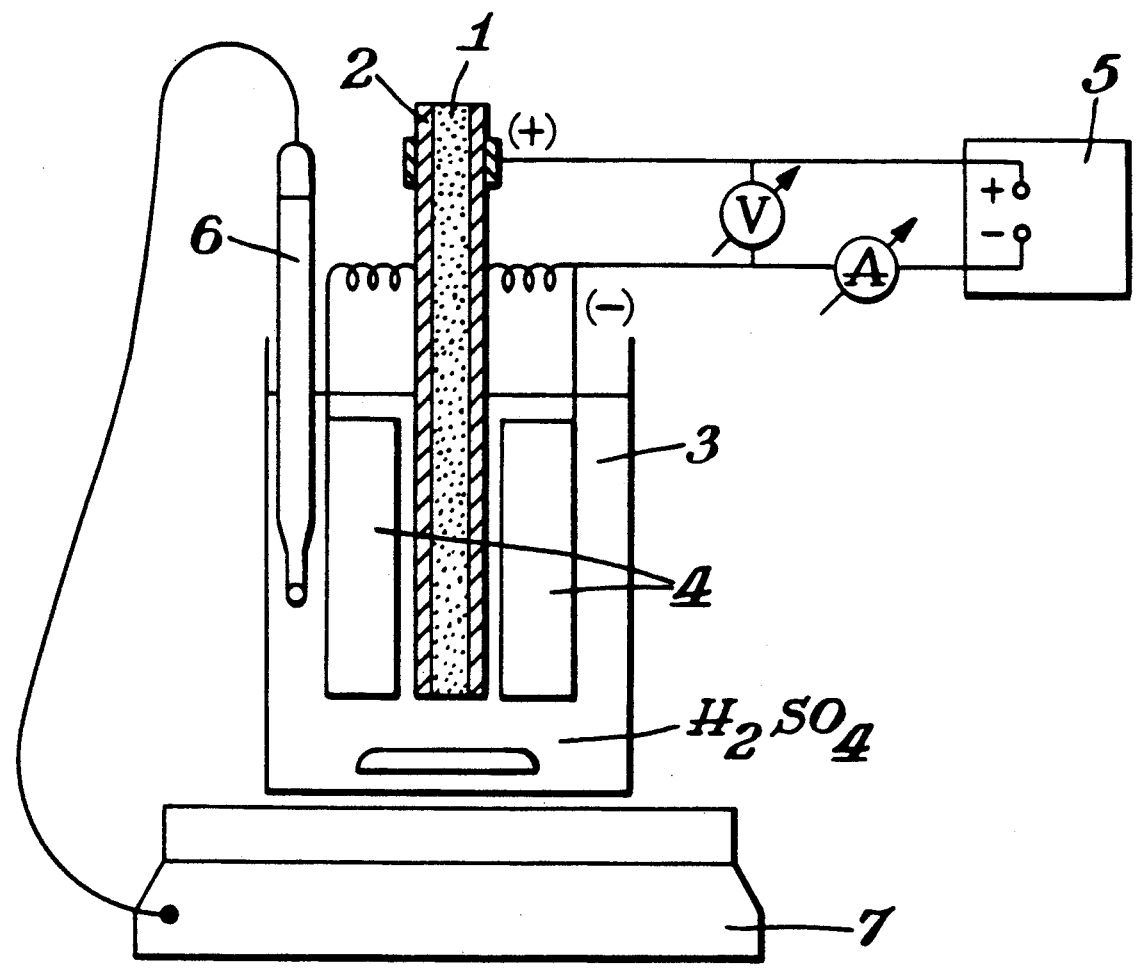

PROCESS FOR PRODUCING MOLDED BODIES FROM PRECURSORS OF OXIDIC HIGH-TEMPERATURE SUPERCONDUCTORS

The melt synthesis of high-temperature superconductor materials based on bismuth strontium calcium cuprates is described in DE 3,830,092 A1. The "BSCCO" high-temperature superconductors which can be prepared according thereto or in another known manner have the composition $Bi_2(Sr,Ca)_3Cu_2O_x$ ("2-layer compound"), the ratio of strontium to calcium being (2 to 5):1 (BSCCO stands for bismuth strontium calcium copper oxide). In addition, "1-layer compounds", $Bi_2(Sr,Ca)_2CuO_x$, and "3-layer compounds", $Bi_2(Sr,Ca)_4Cu_{3x}$, are known as BSCCO high-temperature superconductors. The oxygen index "x" is set by the sum of the valencies of Bi, Sr, Ca and Cu, but is variable to the extent that Bi may be tri- or pentavalent and Cu may be mono- or divalent.

DE 3,830,092 A1 also mentions the production of molded bodies from the bismuth strontium calcium cuprates. Such molded bodies can be obtained, for example, by casting in variously shaped molds which are preferably composed of copper if the mold is open as, for example, in the case of a cavity having inclined sidewalls or a half-cylinder and permits the removal of the casting in terms of shape. It is also important that the casting is carried out with the mold cold so that the solidifying melt cools so rapidly at the mold wall that a chemical reaction with the copper of the mold wall does not occur. Even if the mold wall is flexible and is composed, for example, of a thin metal sheet which can be bent aside after cooling, there are no problems.

Appreciably more difficult is the production of more complicated molded bodies which necessitate a substantially closed mold possibly having a complicated shape. In such cases, even the principle of a rapid cooling to avoid the wall reaction cannot always be used because the mold possibly has to be preheated to avoid an unduly premature solidification of the melt flowing in. In comparatively simple cases, for example in the production of fairly thick cylindrical molded bodies by casting in a tubular mold, a mechanical removal of the casing material is still conceivable, for instance by separating the mold wall into two half shells. However, this is no longer an attractive process even for small diameters and can no longer be used in the case of complicated geometries such as rings or coils.

In order to convert a melt of the composition corresponding to the high-temperature superconductors to the superconducting state after solidification, a subsequent heat treatment of the solidified melt of 6 to 30 hours duration at temperatures around 800° C. in air or oxygen is necessary. However, only one metal is known which is suitable as casing material for BSCCO high-temperature superconductors and is permeable to oxygen at the heat treatment temperatures and, consequently, makes possible the conversion of the solidified melt into the desired high-temperature superconductor inside the metal casing: silver. Unfortunately, at 960.8° C., the melting point of silver is below the temperature at which the superconductor melt has to be in order to be capable of being reliably cast. Thus, a silver mold would melt before the superconductor melt had solidified.

For this reason, it is necessary to resort to copper molds since copper is the only system-immanent metal which is suitable for the present purpose. However, a removal of the copper from the solidified melt is absolutely necessary.

Since the mechanical stripping of the copper mold is only of limited practicability, its chemical dissolution suggests itself. In principle, this is possible with the aid of an oxidizing acid or an acid plus oxidizing agent. Experiments of this type are known in connection with the investigation of yttrium barium cuprate superconductor powders which had been poured into copper tubes and compacted by deep drawing and rolling.

If, however, it is desired to proceed in the same manner in the case of bismuth-based superconductors, a strong attack of the acid on the superconductor or its precursor of the solidified melt is observed as soon as the copper casing is dissolved at one point and the surface of the solidified melt is laid bare. Specifically, it is found that the superconducting bismuth compounds are acid-soluble.

The object of the present invention is to provide a method which makes it possible to dissolve the copper casing without appreciably attacking the underlying superconductor or its precursor.

This object was achieved by anodic oxidation in dilute sulfuric acid. The principle underlying this invention is the formation of a protective layer, which suppresses a further attack of the acid on the superconducting compound, composed of strontium sulfate and/or calcium sulfate from the sulfate contained in the sulfuric acid and the alkaline earth metals contained in the superconductor compound.

The molding to be freed from the copper casing is wired as anode of an electrolysis cell together with a copper cathode. After switching on a suitable electrolysis current, copper dissolves from the casing, copper simultaneously being deposited again at the cathode. In this way, the amount of copper which binds a part of the sulfuric acid originally used remains small so that the concentration of free sulfuric acid can also be kept very low. This is advantageous in relation to the stability of the alkaline earth metal sulfate protective layer on the molding laid bare.

In particular, the invention therefore relates to a process for producing molded bodies from precursors of oxidic high-temperature superconductors of the BSCCO type, which comprises wiring a copper mold of the desired shape which encloses a solidified bismuth strontium calcium cuprate melt as anode in a direct current circuit composed of anode, cathode and an electrolyte, using a dilute sulfuric acid as electrolyte and subjecting the electrolyte to a direct current of 1 to 50 $mA.cm^{-2}$ until the copper mold wired as anode is dissolved and the BSCCO molded body is laid bare.

In addition, the process of the invention may preferably or optionally be one wherein a) one or more molded bodies made of copper are used as cathode;

b) the electrolytic dissolution of the copper mold is carried out at 15° to 70° C.;

c) a copper mold which encloses the solidified bismuth strontium calcium cuprate melt and has one or more openings is wired as anode.

BRIEF DESCRIPTION OF THE DRAWING

The FIGURE shows one embodiment of apparatus for carrying out the electrolysis (anodic oxidation).

DETAILED DESCRIPTION OF THE INVENTION

With reference to the drawing, the copper tube 2 (anode) filled with the solidified superconductor melt 1 is immersed vertically in a beaker 3 filled with the electrolyte (for example, 20% $H_2SO_4$). The anode 2 is surrounded by two copper cathodes 4 which for their part are connected via an electroplating potentiostat 5 to the anode 2. Immersed in the beaker 3 is, in addition, a contact thermometer 6 which controls the heatable magnetic stirrer 7 on which the beaker 3 stands.

As a result of wiring the mold part containing the superconductor core as anode of an electrolysis cell according to the drawing, copper is anodically dissolved and cathodically redeposited on supplying a current. This process is only possible, however, at a minimum concentration of Cu in the electrolyte, and before that hydrogen deposits at the cathode. The copper deposition at the cathode has the advantage that the chosen sulfuric acid concentration can be relatively low since the sulfuric acid is not appreciably consumed. Here it is also possible to carry out the electrolysis at somewhat higher temperature, for example 50° C., at which the reaction overvoltages are reduced. Copper then deposits on the cathode not as sponge, as at room temperature, but in a fairly dense form, as a result of which the danger of a short circuit between the electrodes virtually vanishes. With an anode current density of 20 $mA.cm^{-2}$ and a bath temperature of 40° C., the working voltage is 0.2 V.

Although the superconductor core, which is still in the untempered state which has not been treated with air is not a good electron conductor (the room temperature resistance is 1-3 ohm.cm), its conductivity is nevertheless high enough to polarize the core anodically to such an extent that the copper islands forming in the final stage of the dissolution of the copper casing are not electrically insulated but can also still dissolve, whereas core material already laid bare is protected by the alkaline earth metal sulfate film which forms. In addition, the sulfate film increases the ohmic resistance of the core surface laid bare and consequently reduces the anodic current at these points.

The acid concentration and the treatment temperature are not crucial. For example, 2 to 35% by weight $H_2SO_4$ can be employed. The amount of the dilute sulfuric acid to be used and containing sulfate anions can be very small per se, it only being necessary to exceed the solubility product of calcium sulfate and strontium sulfate in the presence of sulfuric acid at the selected temperature with the formation of a dense sulfate protective film.

EXAMPLE

A spiral of 5 turns of a copper tube having a wall thickness of 0.8 mm and an inside width of 6 mm which was filled with a melt of a bismuth strontium calcium cuprate superconductor of the formula $Bi_2Sr_2CaCu_2O_x$ was wired as anode in a beaker, while a copper cylinder around the spiral on the outside served as cathode together with an additional copper rod in the center of the spiral. 20% sulfuric acid was used as electrolyte. The electrolysis was carried out at a current density of 40 $mA.cm^{-2}$ at room temperature and lasted 20 hours. The superconductor core, to the extent that it was immersed in the electrolyte, was then substantially freed from the copper casing and coated with a thin white layer. No pitting was observed.

We claim:

1. A process for producing molded bodies from precursors of oxidic high-temperature superconductors by electrolytic dissolution of copper molds, which comprises wiring a copper mold of the desired shape which encloses a solidified bismuth strontium calcium cuprate melt as anode in a direct current circuit composed of anode, cathode and an electrolyte, using a dilute sulfuric acid of 2 to 35% by weight strength as electrolyte and subjecting the electrolyte to a direct current of 1 to 50 $mA.cm^{-2}$ until the copper mold wired as anode is dissolved and the BSCCO molded body is laid bare, the BSCCO molded body being protected by a layer composed of at least one of strontium and calcium sulfates, which layer is formed from the sulfate contained in the sulfuric acid and strontium and calcium contained in the BSCCO molded body and suppresses further attack of the sulfuric acid on the BSCCO molded body.

2. A process as claimed in claim 1, wherein one or more molded bodies made of copper are used as cathodes.

3. A process as claimed in claim 1, wherein the electrolytic dissolution of the copper mold is carried out at 15° to 70° C.

4. A process as claimed in claim 1, wherein a copper mold which encloses the solidified bismuth strontium calcium cuprate melt and has one or more openings is wired as anode.

* * * * *